United States Patent [19]
Layton et al.

[11] Patent Number: 5,323,294
[45] Date of Patent: Jun. 21, 1994

[54] LIQUID METAL HEAT CONDUCTING MEMBER AND INTEGRATED CIRCUIT PACKAGE INCORPORATING SAME

[75] Inventors: Wilbur T. Layton; Blanquita O. Morange, both of San Diego; Angela M. Torres, Vista, all of Calif.

[73] Assignee: Unisys Corporation, Blue Bell, Pa.

[21] Appl. No.: 40,732

[22] Filed: Mar. 31, 1993

[51] Int. Cl.$^5$ .............................. H05K 7/20
[52] U.S. Cl. ................ 361/699; 165/80.4; 165/185; 165/907; 257/714; 361/704
[58] Field of Search ........ 165/80.4, 185, 907; 361/382, 385–389; 257/714

[56] References Cited
U.S. PATENT DOCUMENTS

| | | | |
|---|---|---|---|
| 2,946,681 | 7/1960 | Probst et al. | 176/907 |
| 3,694,699 | 9/1972 | Snyder et al. | 361/387 |
| 4,233,645 | 11/1980 | Balderes et al. | 361/385 |
| 4,381,818 | 5/1983 | Sachar et al. | 165/907 |
| 4,823,863 | 4/1989 | Nakajima et al. | 257/714 |

FOREIGN PATENT DOCUMENTS 0243692 10/1988 Japan .................. 165/907

*Primary Examiner*—Gregory D. Thompson
*Attorney, Agent, or Firm*—Charles J. Fassbender; Mark T. Starr

[57] ABSTRACT

An integrated circuit package has an integrated circuit chip, a substrate which holds the chip, and a novel heat conduction mechanism which is coupled to the chip and which provides a path for conducting heat from the chip to a fluid medium. This heat conduction mechanism is characterized as including a) a compliant body, having microscopic voids throughout, which is disposed in and fills a gap in the heat conducting path, and b) a liquid metal alloy that is absorbed by and partially fills the microscopic voids of the compliant body. Due to the presence of the liquid metal alloy, the thermal conductivity through the body is high. Also, due to the voids in the body being only partially filled with the liquid metal alloy, the body can be compressed by dimensional variations within the integrated circuit package without squeezing out any of the liquid metal alloy that is held therein.

19 Claims, 4 Drawing Sheets

LIQUID METAL HEAT CONDUCTING MEMBER AND INTEGRATED CIRCUIT PACKAGE INCORPORATING SAME

BACKGROUND OF THE INVENTION

This invention relates to heat conducting mechanisms; and more particularly, it relates to such mechanisms in integrated circuit packages, which conduct heat away from the integrated circuit chips that lie therein.

In the prior art, it is known that an integrated circuit chip dissipates heat while the chip is operating. Thus, the problem arises of how to prevent the temperature of the chip from exceeding a certain maximum level at which the chip begins to degrade in reliability or performance.

To solve the above problem, various mechanisms for conducting heat away from the integrated circuit chip have been disclosed. For general background mechanisms, see for example, U.S. Pat. No. 4,791,983 by E. Nicol and G. Adrian, entitled "Self Aligned Liquid-Cooling Assembly;" or see U.S. Pat. No. 4,879,629 by J. Tustaniwskyj, and K. Halkola entitled "Liquid Cooled Multi-chip Integrated Circuit Module Incorporating A Seamless Compliant Member For Leakproof Operation."

Now in each mechanism which conducts heat away from an integrated circuit chip, that heat will flow from the chip along a thermal conduction path to either the surrounding air or to a liquid coolant. Also, the thermal conduction path will include one or more joints between different components which may be soldered or pressed together.

In the case where all the joints are soldered, the task of taking the integrated circuit package apart in order to replace a defective chip is made difficult. On the other hand, in the case where one or more joints are pressed, the thermal conductivity through them is reduced.

To address the above problem, two materials respectively known as a "thermal grease" and a "liquid metal paste" have been developed. These materials are placed in the joint to fill any voids which may lie therein; and they are described in U.S. Pat. No. 5,056,706 by T. Dolbear C. Mackay, and R. Nelson entitled "Liquid Metal Paste For Thermal And Electrical Connections".

However, a drawback of the thermal grease is that its thermal conductivity, in comparison to the thermal conductivity of a liquid metal, is relatively low. See U.S. Pat. No. 5,056,706 at column 2, lines 24–29.

Also, a drawback of the liquid metal paste is that for many paste compositions, the viscosity will be so low that the paste will not hold its shape. Consequently, a separate barrier must be provided in the integrated circuit package to prevent the paste from running. This and item 26 in FIG. 3.

To increase the viscosity of the paste, the relative portions of the constituent materials can be changed. However, as the paste is made stiffer, the degree to which it fills the voids in the joint decreases; and thus the thermal conductivity through the joint decreases.

For example, FIG. 5 of U.S. Pat. No. 5,056,706 shows a phase diagram of a liquid metal paste which is a mixture of Al and Ga; and column 8, lines 44–47 says that "any mixtures of the Al and Ga between the lines 30 and 32 at the temperatures involved will remain a paste and be suitable for the applications herein discussed." However, a mixture at one extreme of 65% Ga and 35% Al is nearly a liquid (which will require a separate barrier to hold it in place); and a mixture of the other extreme of 1% Ga and 99% Al is essentially a solid (which is too stiff to fill voids or gaps in a joint.

Further, even if liquid metal paste has an ideal viscosity, it still often requires a separate physical barrier to hold it in place. This occurs when the width of the gap which the paste is to fill varies significantly due to dimensional tolerances In that case, a portion of the paste can get squeezed out of the gap and cause a short or other defect in the package.

Accordingly, a primary object of the invention is to provide an integrated circuit package in which the above problems are overcome.

BRIEF SUMMARY OF THE INVENTION

In accordance with the present invention, an integrated circuit package is comprised of an integrated circuit chip, a substrate which holds the chip, and a heat conduction mechanism which is coupled to the chip and which provides a path for conducting heat from the chip to a fluid medium. Also, this heat conduction mechanism further includes a) a compliant body, having microscopic voids throughout, which is disposed in and fills a gap in the heat conducting path, and b) a liquid metal alloy that is absorbed in the microscopic voids of the compliant body and partially fills them.

In one particular embodiment, the compliant body is continuous and porous, and the liquid metal alloy adheres to the surfaces but does not fill most of the pores. In another particular embodiment, the compliant body is a mesh of multiple interval fibers, and the liquid metal alloy adheres to the surfaces but does not fill the mesh.

Due to the presence of the liquid metal alloy, the thermal conductivity through the body is high. Also, due to the voids in the body being only partially filled with the liquid metal alloy, the body can be compressed by dimensional variations within the integrated circuit package without squeezing out any of the liquid metal alloy that is held therein. Consequently, the need for a separate barrier for the liquid metal alloy within the integrated circuit package is eliminated.

BRIEF DESCRIPTIONS OF THE DRAWINGS

Several preferred embodiments of the invention, as well as their features and methods of fabrication, are described herein in conjunction with the accompanying drawings wherein.

DETAILED DESCRIPTION

Figure 1:
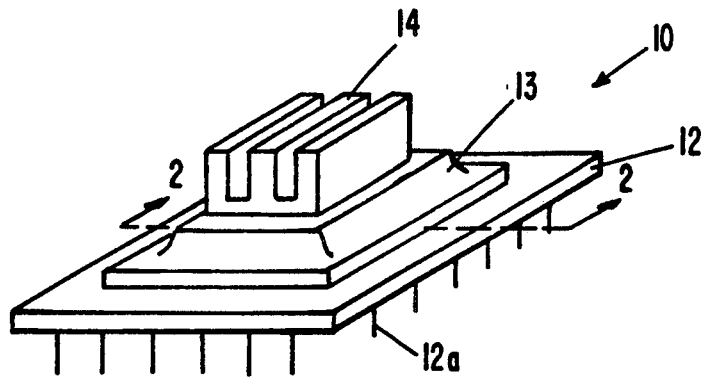
FIG. 1 is a pictorial view, at approximately actual size, of an integrated circuit package which is a first preferred embodiment of the invention.
Figure 2:
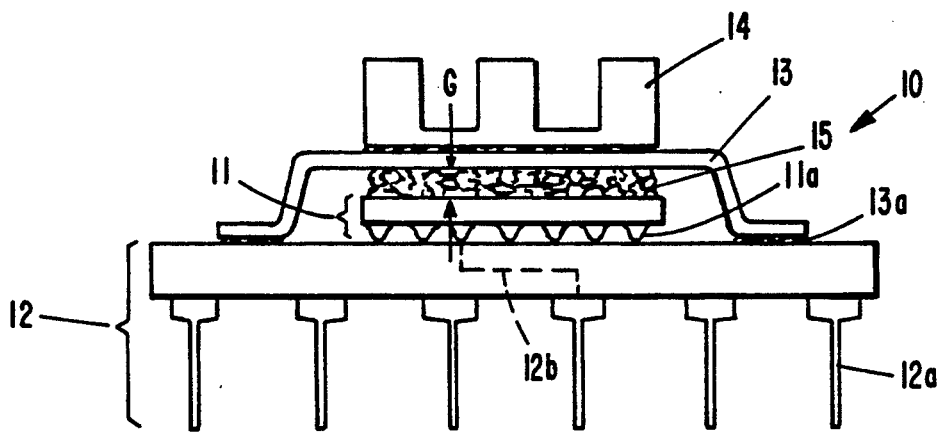
FIG. 2 is a greatly enlarged sectional view of the FIG. 1 embodiment taken along section lines 2—2.
Figure 3:
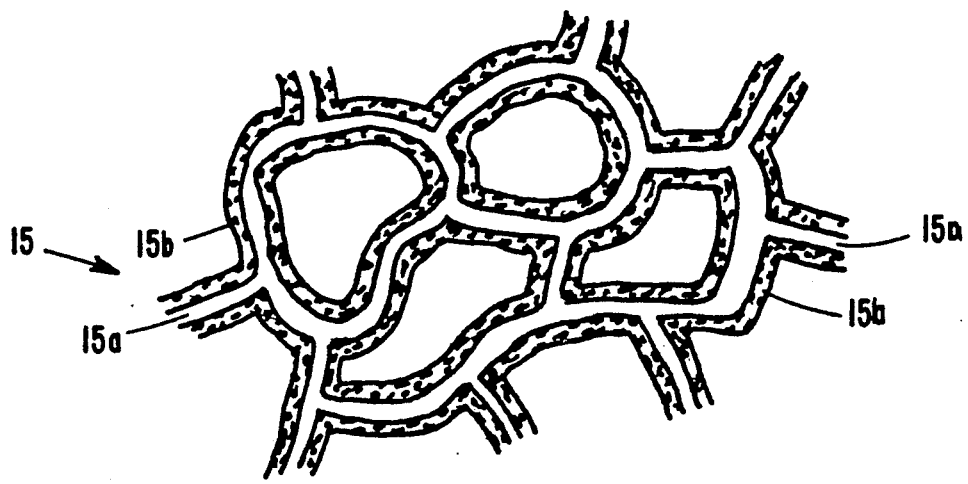
FIG. 3 shows the microscopic structure of a compliant spongy member within the embodiment of FIGS. 1 and 2.

Referring now to FIGS. 1, 2 and 3, the details of an integrated circuit package 10 which is structured as one preferred embodiment of the invention will be described. This integrated circuit package 10 includes an integrated circuit chip 11 having input/output terminals 11a, a ceramic substrate 12 having input/output terminals 12a, a lid 13, a heatsink 14, and a spongy compliant member 15 which lies between the chip 11 and the lid 14.

Each of the chip terminals 11a is a solder bump which is soldered to a signal pad (not shown) on the top surface of the substrate 12; and each of the substrate terminals 12a is a metal pin which is brazed to a signal pad (not shown) on the bottom surface of the substrate 12. Likewise, the lid 13 is attached by solder or epoxy 13a to the substrate 12, and the heat sink 14 is attached by solder or a thermally conductive epoxy to the lid 13. By comparison, member 15 is held in place simply by being squeezed between the chip 11 and the lid 13.

Included in the chip 11 are thousands of microscopic electronic circuits (not shown) which can be of any type, such as digital logic circuits. Electrical signals and power are sent to and received from these circuits over signal lines which run through the substrate 12 and interconnect the chip terminals 11a to the substrate terminals 12a. One such signal line is indicated as an example by reference numeral 12b.

While the circuits on the chip 11 are sending and receiving signals as described above, the chip 11 dissipates heat. And the primary function which is performed by the components 13, 14, and 15 in combination is to provide a highly efficient heat conduction mechanism which carries heat away from the chip 11.

Now in order for the heat conduction path through the components 13, 14, and 15 to have a high thermal conductivity, it is critical that the gap G between the chip 11 and the lid 13 be completely filled by member 15, and that member 15 itself have a high thermal conductivity. These two requirements are met in accordance with the present invention by providing member 15 with a microscopic structure as shown in FIG. 3.

Reference numeral 15a in FIG. 3 indicates a porous spongy body; and, reference numeral 15b indicates a coating of a liquid metal alloy on the surface of the pores in the body 15a. These pores, with the liquid metal alloy 15b, run throughout the body 15a; and thus the liquid metal provides a continuous heat conducting path through the body.

An example of two specific materials which have been used by the present inventors to build and test the porous spongy body 15a with the liquid metal alloy 15b respectively are polyurethane foam and Ga, In, Sn, Zn (61%, 25%, 13%, 1%). Microphotos of this embodiment will be described shortly in conjunction with FIGS. 4C, 4D, and 4F.

One important feature of the above described member 15 is that it has a high thermal conductivity. This occurs even though the thermal conductivity of the porous body 15a by itself is low, because the thermal conductivity of the liquid metal 15b is high. As a typical numerical example, the thermal conductivities of items 15a, 15b, and 15 respectively are 0.01 watts /(meter-degree C), 30–100 watts /(meter-degree C), and 5–20 watts /(meter-degree C).

Another important feature of member 15 is that due to its spongy body 15a, it accommodates variations in the width of the gap G between the chip 11 and the lid 13. This is important when the integrated circuit package 10 is mass produced because in that case, various dimensional tolerances will cause the widths of the gap G to vary from one package to another. And, if these dimensional tolerances cause a film of air to exist between the liquid metal 15b and the lid 13, the thermal conductivity from the chip 11 to the heat sink 14 will be greatly decreased.

A numerical example of the types of tolerances which member 15 accommodates is as follows: flatness variations in the top surface of substrate 12 of 2 mils per inch; height variations in the lid bond 13a of ±2 mil; height variations in the lid 13 itself of ±3 mils when the lid is formed by stamping; and, chip thickness variations of ±1 mil. These dimensional tolerances, with a substrate that is two inches long, give rise to a gap width variation of ±10 mils.

Still another important feature which member 15 achieves is that it eliminates the need for a separate physical barrier around the perimeter of the top surface of the chip 11 in order to hold the liquid metal alloy 15b in place. This feature is achieved because the liquid metal alloy 15b is held in place by the high surface tension of the liquid metal alloy, and the adhesive forces between the liquid metal alloy and the surfaces of the porous body 15a. Also, since the liquid metal alloy 15b does not completely fill the pores, the porous body 15a can be squeezed to accommodate variations in the gap G without causing the liquid metal alloy 15a to ooze out.

Likewise, member 15 eliminates the need to provide the lid 13 with any fill hole through which the liquid metal alloy can be entered behind the barrier; and, it also eliminates the step of entering the liquid metal and subsequently plugging the fill hole.

Figure 4A:
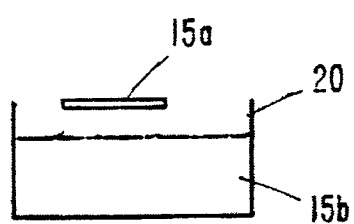
FIGS. 4A–4F are a set of sketches and microphotographs which together illustrate the steps of a preferred process for fabricating the embodiment of FIGS. 1-3.
Figure 4B:
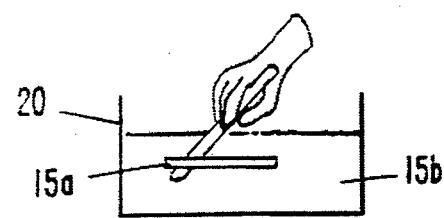
Figure 4E:
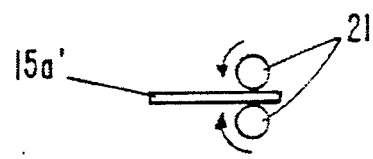
Figure 4C:
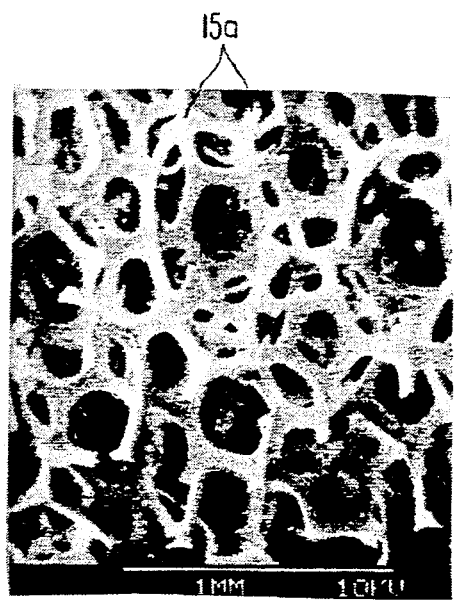
Figure 4D:

Turning next to FIGS. 4A–4F, a preferred process for fabricating member 15 will be described. To is provided as shown in FIG. 4A. Then, the spongy porous body 15a is placed in the tub 20 and mixed with the liquid metal alloy 15b as shown in FIG. 4B. Due to the FIG. 4B step, the spongy porous body 15a becomes saturated with the liquid metal alloy 15b. This is seen by comparing the microphotos of FIGS. 4C and 4D which respectively show the spongy porous body before (15a) and after (15a') it is mixed with the liquid metal alloy 15b.

Figure 4F:
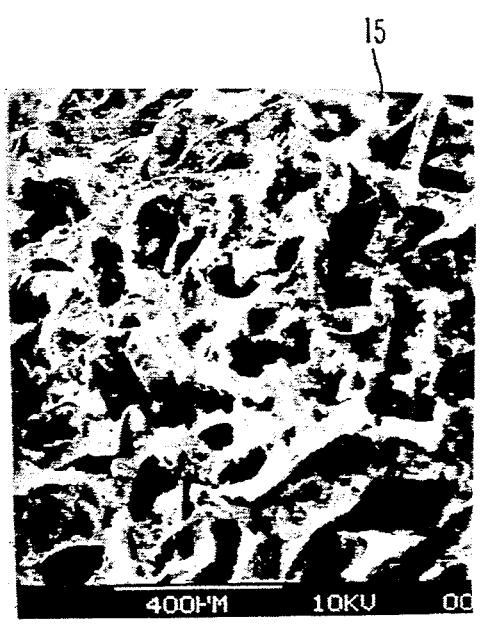

Thereafter, as shown in FIG. 4E, the saturated porous body 15a' is run through a pair of rollers 21 which squeezes a portion of the liquid metal alloy 15b from the porous body. As a result, only the surfaces of essentially all of the pores remain coated with the liquid metal alloy 15b. This is seen in the microphoto of FIG. 4F wherein item 15 is the same as that which was previously described in conjunction with the integrated circuit package 10 of FIG. 2.

A preferred embodiment of the invention, as well as a preferred process for making that embodiment, has now been described in detail. In addition, however, many changes and modifications can be made to those details without departing from the nature and spirit of the invention.

Figure 5:
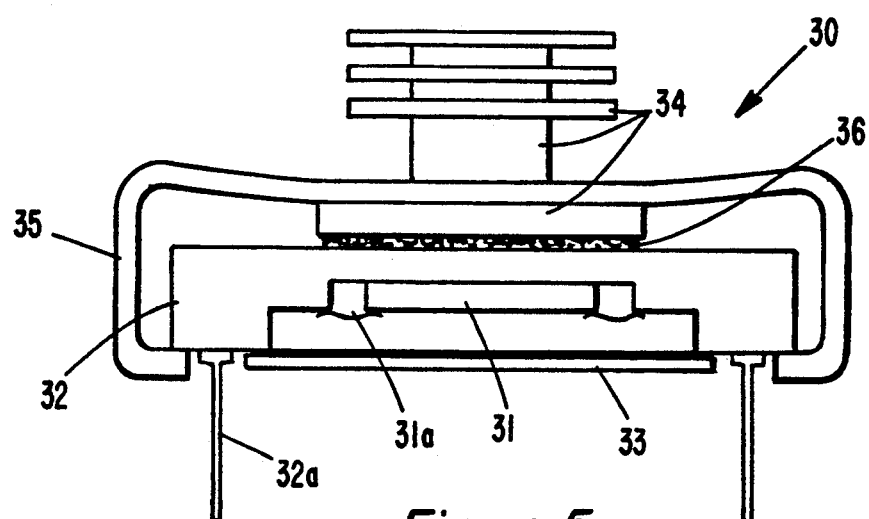
FIG. 5 is a sectional view of an integrated circuit package which is a second preferred embodiment of the invention.

For example, another integrated circuit package 30 which constitutes a second embodiment of the invention is shown in FIG. 5. This integrated circuit package 30 includes an integrated circuit chip 31, input/output wire bond terminals 31a, a ceramic substrate 32 having input/output terminals 32a, a lid 33, a heat sink 34, a retainer 35, and a spongy compliant member 36 which lies between the substrate 32 and the heat sink 34.

Chip 31 is soldered to the substrate 32, and the lid 33 is also soldered to the substrate 32. By comparison, the heat sink 34 and spongy compliant member 36 are held is place by the retainer 35 which acts as a spring that squeezes all of the components 32, 34, and 36 together.

In the integrated circuit package 30, the spongy compliant member 36 has the same structure and is made by the same process as the previously described member 15. Consequently, the integrated circuit package 30 has all of the features that were previously described in conjunction with member 15.

Figure 6:
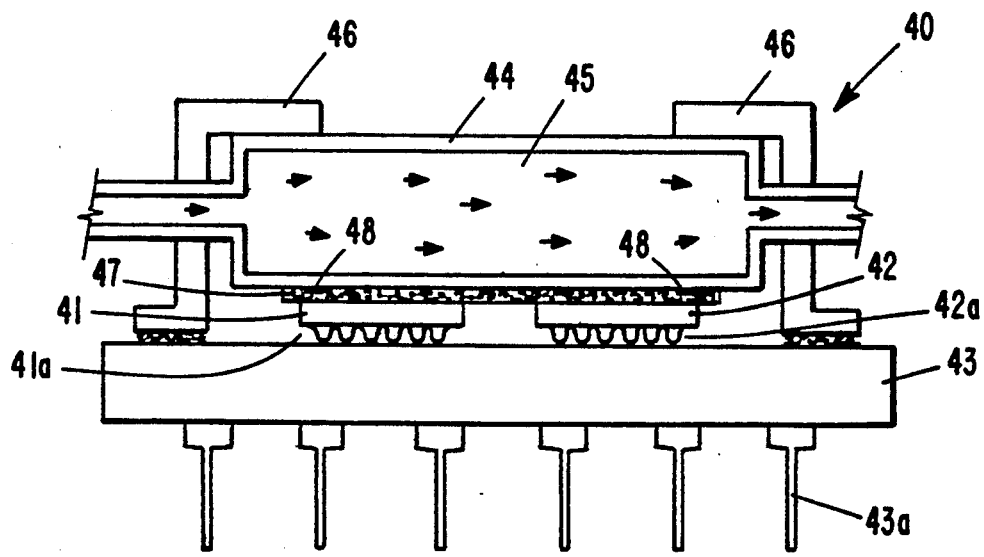
FIG. 6 is a sectional view of an integrated circuit package which is a third preferred embodiment of the invention; and, FIG. 7 shows the microscopic structure of a compliant spongy member, which is an alternative to the compliant spongy member of FIG. 3 in the integrated circuit packages of FIGS. 2, 5 and 6.

Next, with reference to FIG. 6, still another integrated circuit package 40, which constitutes a third embodiment of the invention will be described. This integrated circuit package 40 includes two integrated circuit chips 41 and 42 having solder bumps 41a and 42a for input/output terminals, a ceramic substrate 43 having pins 43a for input/output terminals, a conduit 44 which carries a liquid coolant 45 (such as water), a retainer 46, and a spongy compliant member 47 which lies between the conduit 44 and the chips 41 and 42.

Each of the chips 41 and 42 are soldered via their solder bumps 41a and 42a to signal pads (not shown) on the substrate 43; and, the retainer 46 also is soldered or epoxied to the substrate 43. Member 47 is held at spots with an adhesive 48, such as two-sided sticky tape, to the conduit 44. Since the area of the adhesive spots 48 is very small relative to top surface area of the chips 41 and 42, any lowering of the thermal conductivity through member 47 is negligible. Lastly, the conduit 44 and member 47 are held in place by the retainer 46 which squeezes member 47 against the chips 41 and 42.

In this integrated circuit package 40, member 47 has the same structure and is made by the same process as member 15 of FIGS. 2-4F; and thus, the integrated circuit package 40 has all of the features that were described in conjunction with member 15.

Figure 7:
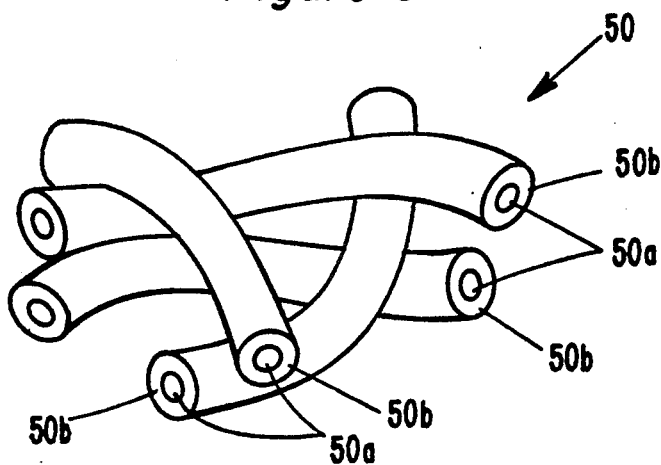

Considering now FIG. 7, it shows the microscopic structure of a member 50 which is alternative embodiment of the previously described members 15, 36, and 47. As shown in FIG. 7, member 50 is structured as a mesh of multiple interwoven fibers 50a; and these fibers are coated with a liquid metal alloy 50b. An example of two specific materials that were used by the present inventors to actually construct the fibrous mesh 50a with the liquid metal alloy respectively are cellulose and Ga, Sn, Zn (82%, 12%, 6%).

In member 50, the liquid alloy 50b is again held on the fibrous mesh 50a by the high surface tension of the liquid metal alloy, and the adhesive forces between the liquid metal alloy and the surfaces of the porous body 15a. Also, the fibrous mesh 50a makes the member 50 compliant and spongy; and, all of the spaces between the fibers are not completely full of the liquid metal alloy.

As a result, member 50 has all of the features of member 15. These features include a) a high thermal conductivity through the liquid metal alloy 50b, and b) an ability to be squeezed by dimensional variations within an integrated circuit package and/or by a springy retainer without losing hold of the liquid metal. Thus, the need for a separate barrier for the liquid metal within the integrated circuit package is eliminated.

To fabricate member 50, the steps of FIGS. 4A, 4B, and 4E may be used wherein the fibrous mesh 50a is substituted for the porous body 15a. Also, as a modification to making either member 50 or member 15, step 4E can change such that excess liquid metal alloy is removed from the mesh 50a and porous body 15a by either by vacuuming or shaking or centrifuging those components.

When centrifuging is used to remove some of the liquid metal alloy from the porous body 15a or the mesh 50a, it has been found by the inventors that a thin film or web of liquid metal alloy will at times form at random locations across the pores/between mesh fibers. In turn, the surface tension in these films causes the thickness of the porous body/fibrous mesh to significantly shrink to about one-tenth its original thickness. This shrinkage enables a relatively thin member 15 or 50 to be fabricated from a much thicker porous body 15a/mesh 50a (e.g.—a 0.025 inch thick member 15 can be fabricated from a 0.25 inch thick porous body).

Note that in FIG. 7, the fibers 50a in the mesh are unordered. However, as an alternative, the fibers can be ordered or woven in a certain pattern. For example, the fibers 50a can be woven as a cloth or a metal screen.

Next, as a further modification, the above described compliant members 15 of FIG. 3 and 50 of FIG. 7 can be constructed of a wide variety of materials. A listing of suitable materials which is not all inclusive is given below.

Materials for porous body 15a:
Organic Plastics (for example—Polyurethane, Polyethylene, Neoprene, Polyimide, Vinyl Nitride, Nylon).
Cellulose
Silicone
Materials for fibrous mesh 50A: same as for body 15a, metal wire, cotton, wool.
Materials for liquid metal alloy:
Ga, In, Sn, Zn (50%-70%, 15%-35%, 5%-20%, 0.1%-5%)
Ga, In, Sn (50%-70%, 15%-35%, 5%-20%)
Ga, In, Zn (60%-65%, 20%-30%, 5%-20%)
Ga, In (60%-99%, 1%-40%)
Hg, Zn (95%-99%, 1%-5%)

Also, as still another modification, the members 15 of FIG. 3 and 50 of FIG. 7 can be used to conduct heat in heat conducting mechanisms of any kind. That is, although the members 15 and 50 were originally developed to satisfy a need to adequately cool integrated circuits as has been described above, those same members can likewise be used to carry heat away from a variety of other hot objects—such as a power transistor, or a lamp, etc.

Accordingly, in view of all of the above described embodiments as well as the above described variations and modifications thereto, it is to be understood that the invention is not limited to any particular embodiment but so defined by the appended claims.

What is claimed is:

1. An integrated circuit package which is comprised of an integrated circuit chip, a substrate which holds said chip, and a heat conduction mechanism coupled to said chip which provides a path for conducting heat from said chip to a fluid mechanism, wherein said heat conduction mechanism further includes:
   a compliant body, having microscopic voids throughout, which is disposed in a gap, in said heat conducting path, that has predetermined dimensional tolerances;

a liquid metal alloy that is absorbed in said body and partially fills said voids; and, said compliant body being compressed in said gap such that said compliant body fills said gap despite said dimensional tolerances while holding said liquid with a substantially uniform density in said voids.

2. An integrated circuit package according to claim 1 wherein said compliant body is one continuous porous body.

3. An integrated circuit package according to claim 2 wherein said liquid metal alloy adheres to the surfaces, but does not fill, most of the pores in said porous body.

4. An integrated circuit package according to claim 1 wherein said compliant body is a mesh of multiple interwoven fibers.

5. An integrated circuit package according to claim 4 wherein said liquid metal alloy adheres to the surfaces, but does not fill, said mesh of interwoven fibers.

6. An integrated circuit package according to claim 1 wherein said compliant body has a lower thermal conductivity than said liquid metal alloy.

7. An integrated circuit package according to claim 1 wherein said compliant body is an organic plastic.

8. An integrated circuit package according to claim 1 wherein said compliant body is selected from a cellulose, a silicone, a metal, cotton, and wool.

9. An integrated circuit package according to claim 1 wherein said liquid metal alloy contains at least Gallium.

10. An integrated circuit package according to claim 1 wherein said heat conduction mechanism includes a lid which is attached to said substrate and which together with said substrate encloses said chip in a cavity, and wherein said compliant body is squeezed in said cavity between said chip and said lid.

11. An integrated circuit package according to claim 1 wherein said heat conduction mechanism includes a heat sink which is forced towards said substrate by a retainer; and, said compliant body is squeezed between said heat sink and said substrate by said retainer.

12. An integrated circuit package according to claim 1 wherein a certain heat conducting member is in said heat conducting path adjacent said gap, and said compliant body is bonded at spots thereto.

13. An integrated circuit package according to claim 1 wherein—a) there are multiple integrated circuit chips in said package which are held by said substrate, b) said heat conduction mechanism is coupled to each of said chips and provides respective paths for conducting heat therefrom, and c) each such path includes a gap in which said compliant body with said liquid metal alloy is repeated.

14. An integrated circuit package according to claim 1 wherein—a) there are multiple integrated circuit chips in said package which are held by said substrate, b) said heat conduction mechanism is coupled to each of said chips and provides respective paths for conducting heat therefrom, and c) each such path includes a gap in which said compliant body with said liquid metal alloy runs continuously from gap to gap.

15. A compliant thermally conductive member, which is comprised of:

a compliant body having microscopic voids therethrough;

a liquid metal alloy that is absorbed in said body with a substantially uniform density and partially fills said voids; and, said compliant body being compressible enough to fill a gap which has predetermined dimensional tolerances while holding said liquid with said substantially uniform density in said voids.

16. A member according to claim 15 wherein said compliant body is one continuous porous body.

17. A member according to claim 16 wherein said liquid metal alloy adheres to the surfaces, but does not fill, all of the pores in said porous body.

18. A member according to claim 15 wherein said compliant body is a mesh of multiple interwoven fibers.

19. A member according to claim 18 wherein said liquid metal alloy adheres to the surfaces, but does not fill, said mesh of interwoven fibers.

* * * * *